United States Patent
Lee et al.

(10) Patent No.: US 11,152,855 B2
(45) Date of Patent: Oct. 19, 2021

(54) MULTIPLE DITHERING PROFILE SIGNAL GENERATION

(71) Applicant: TEXAS INSTRUMENTS INCORPORATED, Dallas, TX (US)

(72) Inventors: Sang Yong Lee, Chandler, AZ (US); Paul David Curtis, Phoenix, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 68 days.

(21) Appl. No.: 16/779,175

(22) Filed: Jan. 31, 2020

(65) Prior Publication Data

US 2020/0373835 A1 Nov. 26, 2020

Related U.S. Application Data

(60) Provisional application No. 62/850,768, filed on May 21, 2019.

(51) Int. Cl.
*H02M 3/156* (2006.01)
*H02M 1/44* (2007.01)
*H04B 1/69* (2011.01)

(52) U.S. Cl.
CPC ............. *H02M 3/156* (2013.01); *H02M 1/44* (2013.01); *H04B 1/69* (2013.01)

(58) Field of Classification Search
None
See application file for complete search history.

(56) References Cited

U.S. PATENT DOCUMENTS

| | | | |
|---|---|---|---|
| 7,177,166 B1 | 2/2007 | Kris | |
| 7,305,020 B2* | 12/2007 | Tran | G06F 1/10 375/130 |
| 8,319,570 B2 | 11/2012 | Wilson | |
| 10,148,312 B2 | 12/2018 | Yu et al. | |
| 2010/0156493 A1 | 6/2010 | Yedevelly et al. | |
| 2014/0159686 A1 | 6/2014 | Lee et al. | |
| 2017/0092179 A1* | 3/2017 | Lee | G09G 5/008 |
| 2017/0272116 A1* | 9/2017 | Yu | H02M 1/44 |

OTHER PUBLICATIONS

Pareschi et al., "EMI Reduction via Spread Spectrum in DC/DC Converters: State of the Art, Optimization, and Tradeoffs," IEEE Access: The Journal for Rapid Open Access Publishing, vol. 3, 2015, pp. 2857-2874.

(Continued)

*Primary Examiner* — Jeffrey A Gblende
(74) *Attorney, Agent, or Firm* — Michelle F. Murray; Charles A. Brill; Frank D. Cimino

(57) ABSTRACT

At least some aspects of the present disclosure provide for a system. In some examples, the system includes a pulse width modulation (PWM) generator configured to generate a PWM signal. The PWM generator generates the PWM signal by generating a first signal having a first dithering profile and a first frequency bandwidth, generating a second signal having a second dithering profile and a second frequency bandwidth greater than the first frequency bandwidth, modulating the second signal with the first signal to generate a dual random spread spectrum signal, and generating the pulse width modulation signal according to the dual random spread spectrum signal.

24 Claims, 7 Drawing Sheets

(56) References Cited

OTHER PUBLICATIONS

Rice et al., "Understanding Noise-Spreading Techniques and Their Effects in Switch-Mode Power Application," 2008, 26 p.
International Search Report dated Jul. 30, 2020, PCT Application No. PCT/US2020/033399, 2 pages.
Written Opinion dated Jul. 30, 2020, PCT Application No. PCT/US2020/033399, 5 pages.

* cited by examiner

```
//Constants
clk_frequency
clk_divided_frequency
clk_divided_frequency_2
pseudorandom=1
//Random generator
rand = 0
While(1)
Begin While
    Wait for 1/clk_frequency seconds
    //generate random number
    rand = random number from 0 to 3
End While
//Ramp generator (includes clock divider)
ramp = 0
count_up = 1
While(1)
Begin While
    For i = 0 to 15
    Begin For
        Wait for 1/clk_frequency seconds
        If(i<8)
            count_up = 1
        Else
            count_up = -1
        ramp = ramp + count_up
    End For
    //ARSS happens here
    clk_divided_frequency = clk_divided frequency+rand*frequency_step
End While
//High frequency ramp for triangle + triangle
ramp_2 = 0
count_up_2 = 1
While(1)
Begin While
    For i = 0 to 3
    Begin For
        Wait for 1/clk_divided_frequency_2 seconds
        If(i<2)
            count_up_2 = 1
        Else
            count_up_2 = -1
        ramp_2 = ramp + 2 + count_up_2
    End For
End While
//Adder
drss = 0
While(1)
Begin While
    Wait for 1/pwm_clk_frequency
    If(pseudorandom)
        drss = ramp + rand
    Else
        drss = ramp + ramp_2
    Modify pwm_clk_frequency based on drss
End While
```

MULTIPLE DITHERING PROFILE SIGNAL GENERATION

CROSS-REFERENCE TO RELATED APPLICATIONS

The present application claims priority to U.S. Provisional Patent Application No. 62/850,768, which was filed May 21, 2019, is titled "Advanced Dithering For Improved EMI Performance At Multiple Resolution Bandwidths," and is hereby incorporated herein by reference in its entirety.

BACKGROUND

A switched mode power supply (SMPS) transfers power from an input power source to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. An SMPS can include an SMPS controller to provide one or more gate drive signals to the power transistor(s). The SMPS is operated at a switching frequency that can generate noise resulting in electromagnetic interference (EMI) at the switching frequency and its harmonic frequencies.

SUMMARY

At least some aspects of the present disclosure provide for a circuit. In at least some examples, the circuit includes a linear feedback shift register (LFSR), a clock divider, a ramp generator, an adder, and an oscillator. The LFSR comprises a clock input terminal configured to receive a clock signal, a first output terminal, and a second output terminal. The clock divider comprises a clock input terminal configured to receive the clock signal, a first input terminal coupled to the first output terminal of the LFSR, a second input terminal coupled to the second output terminal of the LFSR, and an output terminal. The ramp generator comprises an input terminal coupled to the output terminal of the clock divider and an output terminal. The adder comprises a first input terminal coupled to the output terminal of the ramp generator and a second input terminal coupled to the first output terminal of the LFSR, and an output terminal. The oscillator comprises a first input terminal coupled to the output terminal of the adder and an output terminal.

Other aspects of the present disclosure provide for a circuit. In at least some examples, the circuit includes a LFSR, a clock divider, a ramp generator, an adder, and an oscillator. The LFSR is clocked by a clock signal and configured to output a pseudorandom value in a digital data format. The clock divider is configured to receive the clock signal and divide the clock signal by the pseudorandom value to generate and output a divided clock signal. The ramp generator is configured to receive the divided clock signal, generate a ramp signal according to the divided clock signal, and output the ramp signal in the digital data format. The adder is configured to modulate the ramp signal with the pseudorandom value to generate a dual random spread spectrum signal. The oscillator is configured to receive the dual random spread spectrum signal and generate a pulse width modulation signal according to the dual random spread spectrum signal.

At least some aspects of the present disclosure provide for a system. In some examples, the system includes a pulse width modulation (PWM) generator configured to generate a PWM signal. The PWM generator generates the PWM signal by generating a first signal having a first dithering profile and a first frequency bandwidth, generating a second signal having a second dithering profile and a second frequency bandwidth greater than the first frequency bandwidth, modulating the second signal with the first signal to generate a dual random spread spectrum signal, and generating the pulse width modulation signal according to the dual random spread spectrum signal.

BRIEF DESCRIPTION OF THE DRAWINGS

For a detailed description of various examples, reference will now be made to the accompanying drawings in which:

FIG. 8 shows a table of illustrative pseudocode in accordance with various embodiments.

DETAILED DESCRIPTION

Figure 1:
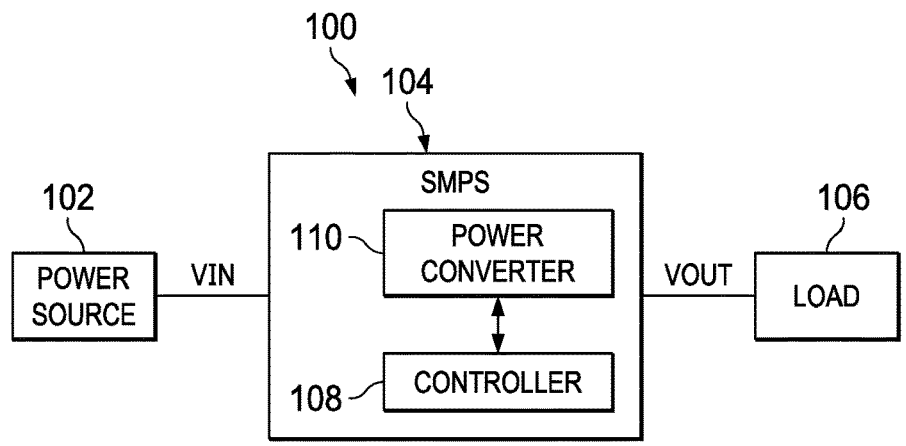
FIG. 1 shows a block diagram of an illustrative system in accordance with various examples.

In a switched mode power supply (SMPS), power transistors are controlled (e.g., switched) to turn on and off at a particular frequency referred to as a switching frequency. The nature of the switching behavior of the power transistors creates and/or generates electromagnetic energy (e.g., conducted and/or radiated) spectral frequency spurs at the switching frequency and each of its harmonic frequencies. These spectral frequency spurs are referred to as electromagnetic interference (EMI) that has a maximum amount of energy at the switching frequency. The generation of this sound can sometimes be undesirable. In at least some examples, a maximum amount of EMI energy permitted in a certain system at a certain frequency is limited. For example, various standards or governmental regulations limit the maximum amount of EMI energy permitted at a certain frequency in systems such as automobiles, audio equipment, or other applications in which excessive EMI at that certain frequency may be undesirable and/or inhibit normal or expected operation of the systems.

Some techniques exist for reducing the peak energy of the EMI at the switching frequency. For example, various dithering techniques spread the EMI energy out across multiple frequencies (e.g., a frequency band). These dithering techniques are sometimes referred to as spread spectrum dithering. Spread spectrum dithering changes the switching frequency between multiple values across a predetermined bandwidth, spreading the spectral energy of the EMI across the predetermined bandwidth. This prevents focusing of the spectral energy at the switching frequency and reduces a peak spectral energy at the switching frequency. Some dithering techniques are more suited for certain frequency ranges than others. For example, an analog dithering technique that generates a triangular ramp signal may provide optimal performance for dithering at low frequencies. A digital dithering technique such as pseudorandom spread spectrum (PRSS) dithering may provide optimal performance for dithering at high frequencies. However, a dithering technique that provides optimal performance for one frequency range (e.g., high or low) may not provide optimal performance for the other frequency range, and in some examples can decrease system performance in the other frequency range.

Aspects of the present disclosure provide for a generation of a dual random spread spectrum dithering (DRSS) signal using multiple dithering profiles (e.g., dithering signal shapes) or techniques simultaneously. For example, a first signal is generated as either representative of an analog signal or as a digital signal and is a first modulation signal for modulating an output of an oscillator and is output as a plurality of digital bits. Alternatively, in some examples, the first signal is output in an analog format. In some examples, the first signal is representative of an analog triangular ramp, as discussed above. A second signal is generated as either representative of an analog signal or as a digital signal and the first signal is modulated by the second signal to generate the DRSS signal. In some examples, the second signal is a PRSS signal. The first signal is modulated by the second signal, in some examples, by adding the first signal to the second signal. The DRSS signal is output, in some examples, as a plurality of digital bits (e.g., data in a digital data format). In at least one example, generating the DRSS signal by modulating the first signal with the second signal is referred to as DRSS dithering. In another example, a result of modulating the first signal with the second signal is further modulated by another signal to generate the DRSS signal. In yet other examples, any number of signals, each optimized for varying frequencies, are modulated together or otherwise combined to form the DRSS signal. When the DRSS signal is generated by combining more than two signals, the DRSS signal may be renamed to reflect a number of combined signals. An oscillator is controlled according to the DRSS signal to generate a pulse-width modulation (PWM) clock signal for controlling another component (e.g., such as for controlling a power converter, setting a latch or other component that controls a power converter or yet another component, etc.). For the sake of consistency and clarity of description, the first signal includes digital bits representative of a triangular wave form and the second signal is a PRSS signal in the present disclosure. However, the teachings of the present disclosure are not limited to this singular example and the first signal and the second signal may each be any signal suitable for use in modulation and/or dithering. For example, in various implementations the first signal is a triangular wave form and the second signal is a triangular wave form, the first signal is a triangular wave form and the second signal is a PRSS signal, the first signal and the second signal are each PRSS signals, the first signal is a PRSS signal and the second signal is a triangular waveform, either of the first signal or the second signal is an adaptive random spread spectrum signal (ARSS), a periodic analog type waveform, etc. ARSS, in at least some examples, is defined as a triangular shaped modulation profile with a modulation period (e.g., triangle width) that is modulated over time. In some examples, the modulation period is changed at the conclusion of each ramp, or at any other point in the cycle. Further, in some examples the modulation period is a fixed value. The periodic analog type waveform, in at least some examples, is either analog or a digital representation of an analog signal, and is capable of occurring in a variety of shapes, including triangular, sinusoidal, exponential, etc.

The first signal is, in some examples, optimized for performing spread spectrum dithering in a low frequency band, such as a frequency band of about 150 kilohertz (kHz) to about 30 megahertz (MHz). Similarly, the second signal is, in some examples, optimized for performing spread spectrum dithering in a high frequency band, such as a frequency band of about 30 MHz to about 108 MHz. Thus, modulating the first signal with the second signal to generate the DRSS signal, in at least some examples, causes the DRSS signal to be optimized for both the low frequency band and the high frequency band. For example, generating the PWM signal according to the DRSS signal reduces a peak energy of EMI in both the low frequency band (e.g., resulting from the first signal) and the high frequency band (e.g., resulting from modulating the first signal with the second signal) when a device is switched according to the PWM signal.

Turning now to FIG. 1, a block diagram of an illustrative system 100 is shown. In at least some examples, the system 100 is an electronic device that includes a power source 102, a SMPS 104, and a load 106. In at least some examples, the system 100 is representative of a consumer electronic device, such as a laptop computer, a smart phone, an audio device, a wearable device, etc. In other examples, the system 100 is representative of a system or subsystem in a transportation vehicle, such as an automobile, aircraft, boat, etc. Generally, the system 100 is representative of any system in which it is desirable and/or required to comply with a particular controlling specification or standard that limits a peak energy of EMI at certain frequencies. One such standard is Comité International Special des Perturbations Radioelectriques (CISPR) 25, specifying peak energy limits at certain frequencies in various vehicles. Other such standards or peak energy limits may be specified in emissions standards established and/or publicized by the Federal Communications Commission or other regulatory bodies.

The power source 102 is, in some examples, a rechargeable or non-rechargeable battery or depletable source of power that outputs VIN. In other examples, the power source 102 is a form of mains power, such as an output of a direct-current (DC) transformer that receives alternating current (AC) or other mains power and generates a DC output signal as VIN. The load 106 is, in some examples, any one or more electrical and/or mechanical components that receives VOUT from the SMPS 104 and operates at least partially according to VOUT. In at least one example, the SMPS 104 includes a controller 108 and a power converter 110. The power converter 110 is any suitable power converter such as a buck power converter, a boost power converter, or a buck-boost power converter. The controller 108 generates PWM that at least partially controls operation of the power converter 110. The controller 108 generates PWM, in at least some examples, based on a DRSS signal to limit EMI generated by the power converter 110 in generating VOUT, as described herein.

Figure 2:
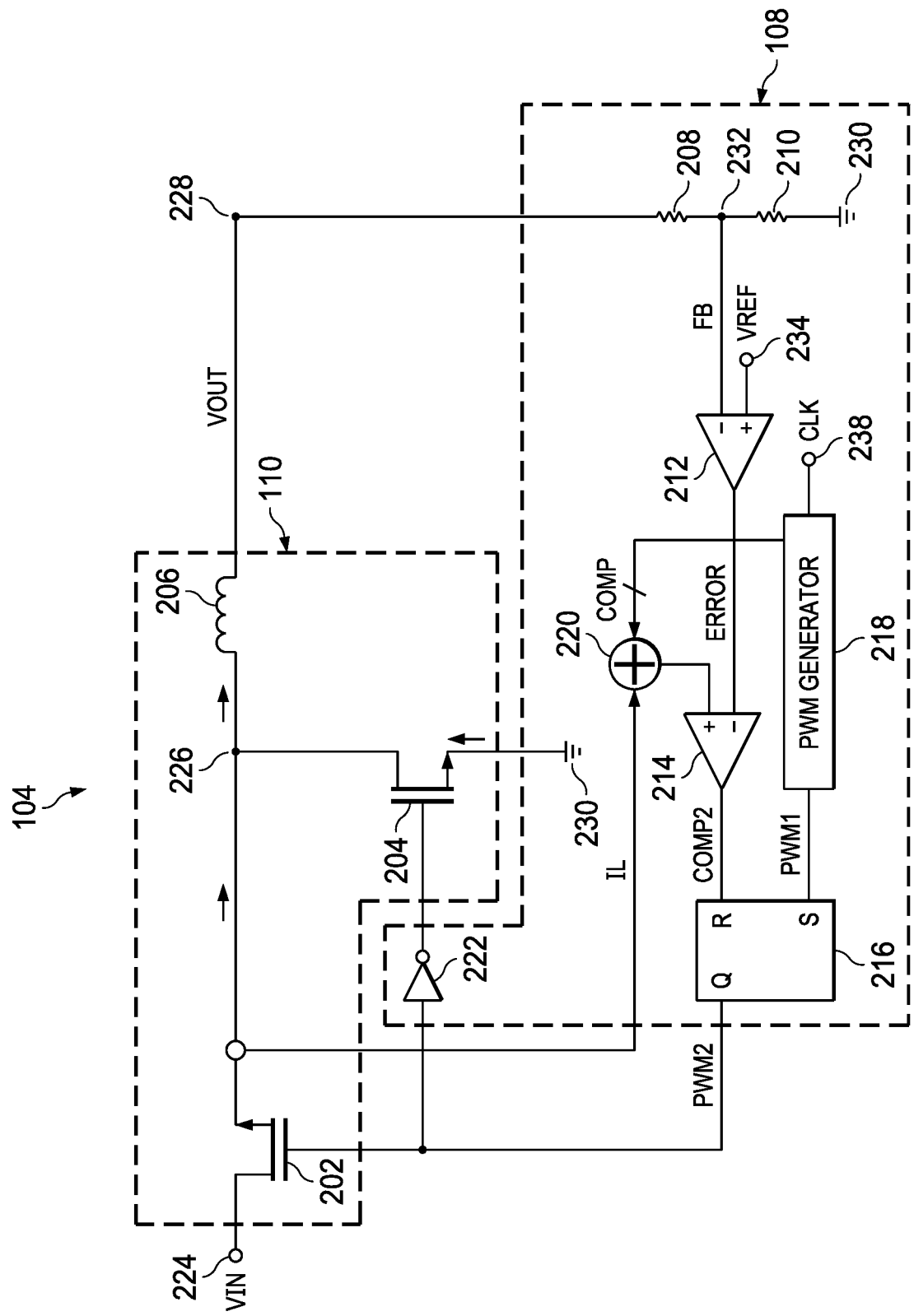
FIG. 2 shows a schematic diagram of an illustrative SMPS in accordance with various examples.

Turning now to FIG. 2, a schematic diagram of an illustrative SMPS 104 is shown. While described as a component of the system 100, in various examples the SMPS 104 is suitable for implementation in other systems or devices in which VIN is received and VOUT is generated by switching one or more components to generate VOUT. In at least some examples, the SMPS 104 includes the controller 108 and the power converter 110. The power convertor 110, in at least some examples, includes a field effect transistor (FET) 202, a FET 204, and an inductor 206. As shown in FIG. 2, the power converter 110 is a current-mode buck switching converter. However, the teachings of the present disclosure are equally applicable to a boost switching converter and a buck-boost switching converter, as well as a voltage-mode converter of buck, boost, or buck-boost topology, or any other suitable power converter topology. The controller 108, in at least some examples, includes a resistor 208, a resistor 210, an amplifier 212, a comparator 214, a latch 216, a PWM generator 218, and an adder 220.

In an example architecture, the FET 202 has a drain terminal coupled to a node 224, a source terminal coupled to a node 226, and a gate terminal. The FET 204 has a drain terminal coupled to the node 226, a source terminal coupled to a ground node 230, and a gate terminal. The inductor 206 is coupled between the node 226 and a node 228. The resistor 208 is coupled between the node 228 and a node 232. The resistor 210 is coupled between the node 232 and the ground node 230. The amplifier 212 has a first input terminal (e.g., a negative or inverting input terminal) coupled to the node 232, a second input terminal (e.g., a positive or non-inverting input terminal) coupled to a node 234, and an output terminal. The comparator 214 has a first input terminal (e.g., a positive or non-inverting input terminal), a second input terminal (e.g., a negative or inverting input terminal) coupled to the output terminal of the amplifier 212, and an output terminal. The latch 216 has a reset input terminal coupled to the output terminal of the comparator 214, a set input terminal, and an output terminal. The PWM generator 218 has an input terminal coupled to a node 238, a first output terminal coupled to the set input terminal of the latch 216, and a second output terminal coupled to an input terminal of the adder 220. The adder 220 further has another input terminal configured to receive a signal (IL) indicative of a current flowing through the power converter 110. The output terminal of the latch 216 is coupled to the gate terminal of the FET 202. The output terminal of the latch 216 is further coupled to the gate terminal of the FET 204 through an inverter 222. In other examples, the inverter 222 is omitted and an inverting output terminal (not shown) of the latch 216 is coupled to the gate terminal of the FET 204.

In an example of operation, the controller 108 controls the power converter to generate an output voltage (VOUT) at the node 228 based at least partially on an input voltage (VIN) received at the node 224. Based on a PWM output signal (PWM2) of the latch 216, the FET 202 and the FET 204 are controlled to be conductive or non-conductive, generating VOUT from VIN. The resistor 208 and the resistor 210 together form a voltage divider having an output at the node 232. The signal present at the node 232 is a feedback signal (FB) that is a scaled representation of VOUT, scaled based on a ratio of resistances of the resistor 208 and the resistor 210. The amplifier 212 is an error amplifier that outputs a signal ERROR indicating a difference between FB and a reference voltage (VREF) received at the node 234 that is indicative of a desired value for VOUT. The adder 220 receives IL and a slope compensation signal (COMP) and generates an output signal. The comparator 214 receives ERROR and the output signal of the adder 220 and compares the received signals. When the output signal of the adder 220 exceeds ERROR, the comparator 214 outputs a signal (COMP2) having a logical high value. When the output signal of the adder 220 is less than ERROR, the comparator 214 outputs COMP2 having a logical low value. The latch 216 receives COMP2 at the reset input terminal and receives a signal PWM1 at the set input terminal. When PWM1 is asserted, the latch 216 outputs PWM2 having an asserted value. When COMP2 is asserted, the latch 216 outputs PWM2 having a de-asserted value. When PWM2 is asserted, the FET 202 is controlled to be conductive and the FET 204 is controlled to be non-conductive. Similarly, when PWM2 is de-asserted the FET 202 is controlled to be non-conductive and the FET 204 is controlled to be conductive The PWM generator 218 is configured to receive a clock signal (CLK) at the node 238 and generate PWM1 and COMP. For example, based on CLK, the PWM generator 218 generates PWM1 as a modulation of at least two signals. CLK is generated according by any suitable circuit and according to any suitable process, the scope of which is not limited herein. As illustrated in FIG. 2, in at least some implementations PWM1 is a dithered clock signal and COMP is a dithered compensation signal. In one example, the PWM generator 218 receives CLK and divides a frequency of CLK to generate a divided clock signal. In at least one implementation, the PWM generator 218 generates a triangular ramp signal, or a signal having any other suitable profile, based on the divided clock signal. The PWM generator 218, in some examples, generates another triangular ramp signal, or a signal having any other suitable profile, based on CLK or based on a second divided clock signal. In other examples, the PWM generator 218 generates a PRSS signal, for example, as output by a register (such as a linear feedback shift register (LFSR)). The PWM generator 218 subsequently adds the generated signals (e.g., ramp signal+ ramp signal, ramp signal+PRSS signal, etc.) to generate a DRSS signal. The DRSS signal is, in some examples, output by the PWM generator 218 as COMP. The PWM generator 218 further generates PWM1 according to the DRSS signal, for example, trimming an oscillator (not shown) that generates PWM1 according to the DRSS signal.

Figure 3:
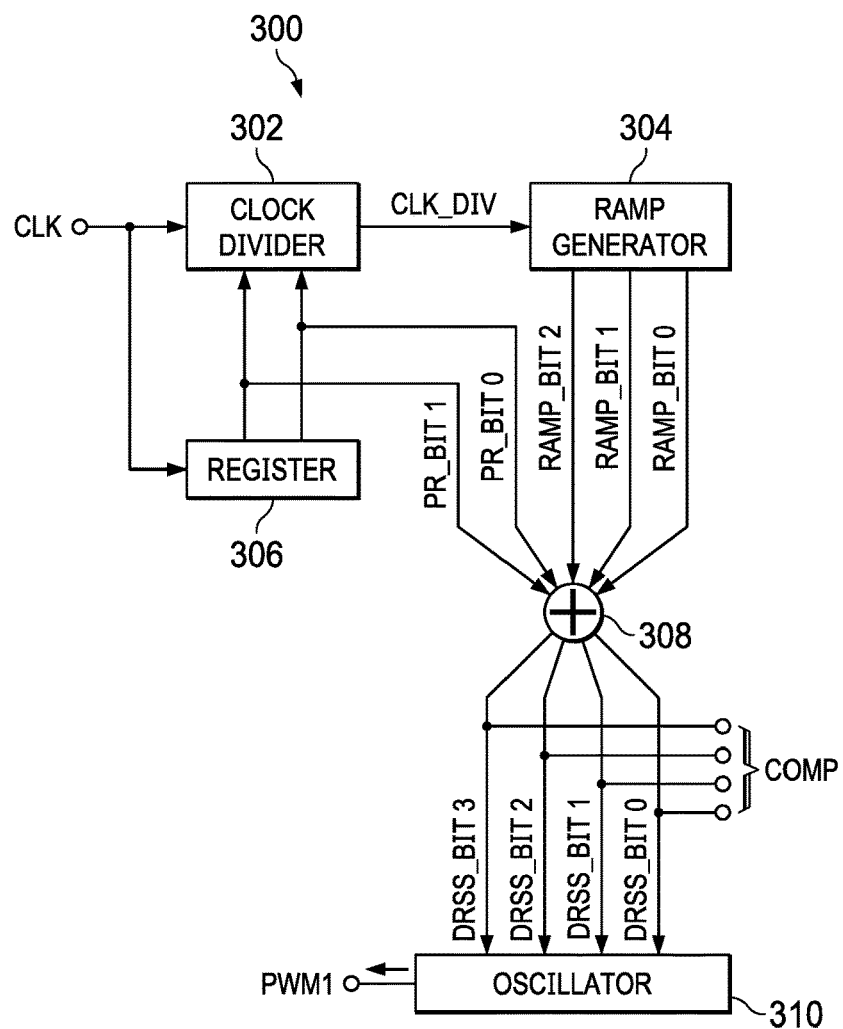
FIG. 3 shows a schematic diagram of an illustrative pulse width modulation (PWM) generator in accordance with various examples.
Figure 4:
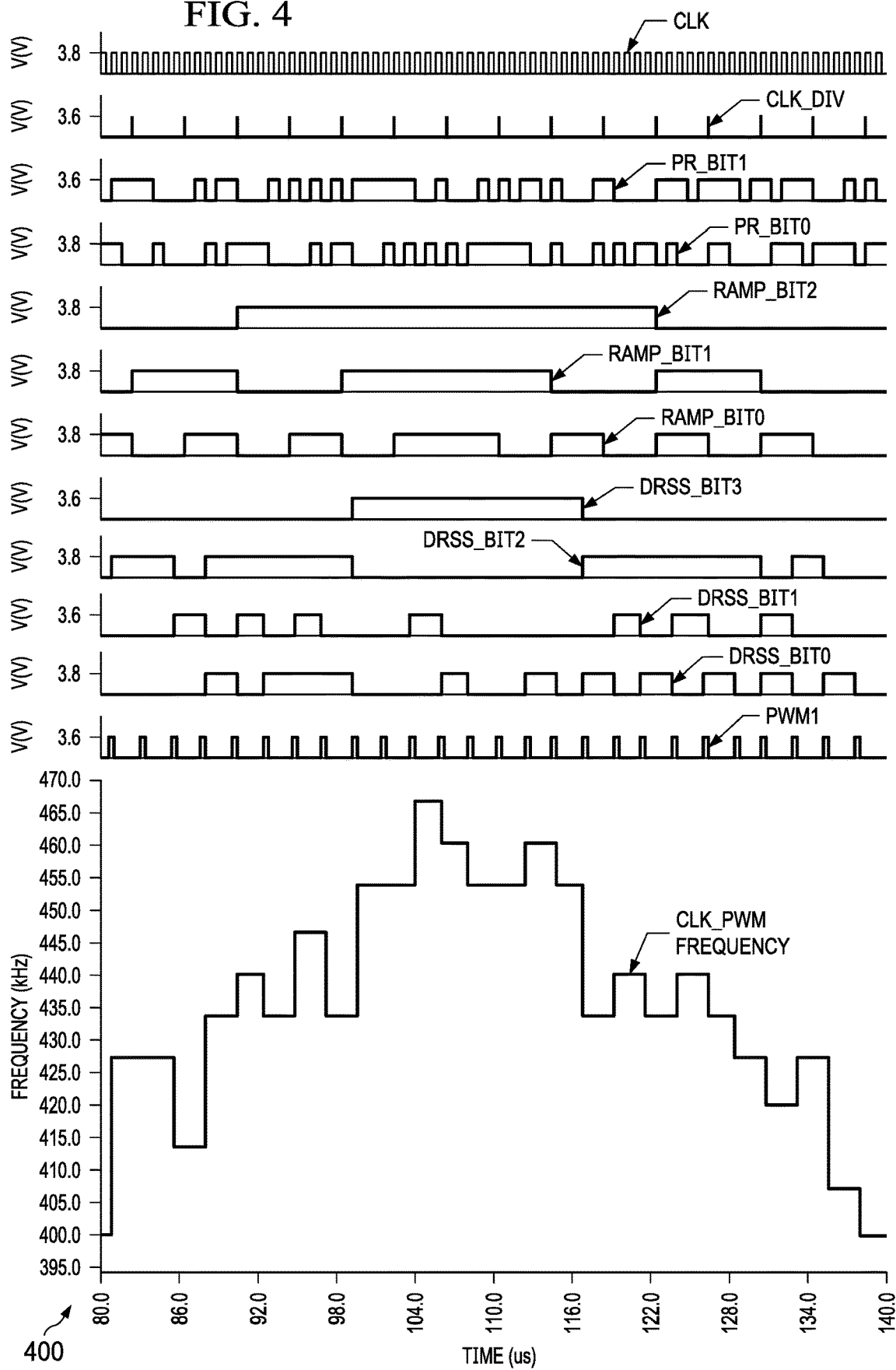
FIG. 4 shows a diagram of illustrative signal waveforms in accordance with various examples.

Turning now to FIG. 3, a schematic diagram of an illustrative PWM generator 300 is shown. In at least some examples, the PWM generator 300 is suitable for implementation in any device or system in which CLK is received and a dithered PWM signal is generated. For example, the PWM generator 300 is suitable for implementation in some SMPS architectures, such as implementation as the PWM generator 218 in the SMPS 104 of the present disclosure. In other examples, the PWM generator 300 is suitable for implementation in other systems that generate a PWM signal according to CLK but are not a SMPS. For example, in devices that include an input pin for providing a clock signal, such as a clock synchronization or sync pin or input, the PWM generator 300 is suitable for coupling at an output terminal to that input pin for providing the PWM signal. Additionally, at least some signals present in the PWM generator 300 are illustrated in the diagram 400 of FIG. 4. Accordingly, understanding of operation of the PWM generator 300 as illustrated in the schematic of FIG. 3 is further enhanced by reviewing the signals illustrated in FIG. 4. The signals illustrated in FIG. 4 correspond by name to the signals described elsewhere herein with respect to generation and function.

In at least one example, the PWM generator 300 includes a clock divider 302, a ramp generator 304, a register 306, an adder 308, and an oscillator 310. In at least some examples, the register 306 is a linear feedback shift register clocked by CLK and having a plurality of output taps that each output one digital data bit. In at least some examples, the register 306 is not included within the PWM generator 300 but is instead a component of a system in which the PWM generator 300 is implemented and to which the PWM generator 300 is configured to couple. In at least one example, the clock divider 302 is configured to receive CLK and generate CLK_DIV. The clock divider 302 is further configured to receive one or more data bits output by the register 306. In at least some examples, which particular data bits of the register 306 are output (e.g., which positions in the register 306) is a matter of design choice. In at least some examples, the clock divider 302 generates CLK_DIV by dividing CLK according to at least some of the data bits received from the register 306. Because the clock divider 302 generates CLK_DIV according to the data bits received from the register 306, a frequency of CLK_DIV varies with changes to values of the data bits output by the register 306. In this way, from clock cycle to clock cycle, the frequency of CLK_DIV varies.

The ramp generator 304 is coupled to the clock divider 302 and is configured to receive CLK_DIV. Based on CLK_DIV, the ramp generator 304 generates a ramp signal and outputs a plurality of data bits (e.g., RAMP_BIT0, RAMP_BIT1, . . . RAMP_BITX) representative of a value of the ramp signal for each clock cycle of CLK_DIV. In at least some examples, the data bits output by the ramp generator 304 comprise a digital representation of an analog signal (e.g., a digital representation of a triangular waveform). However, in other examples the ramp generator 304 outputs a ramp signal in an analog format. The adder 308 receives the data bits output by the ramp generator 304 and at least some of the data bits output by the register 306, adds the data bits output by the register 306 to the data bits output by the ramp generator 304 to generate the DRSS signal, and outputs the DRSS signal as a plurality of data bits (DRSS_BIT0, DRSS_BIT1, . . . DRSS_BITX). In at least some examples, the data bits (e.g., PR_BIT0, PR_BIT1, etc.) output by the register 306 comprise a PRSS signal.

The oscillator 310 is configured to receive the plurality of data bits output by the adder 308. In at least some examples, the oscillator 310 generates the PWM signal by charging and discharging a capacitor (not shown). In this way, in at least some examples, an output terminal of the oscillator 310 is coupled to, or is, an output node of the PWM generator 300. The oscillator 310 charges the capacitor, in at least some examples, by sourcing current to the capacitor via a programmable current source (not shown). A current output by the variable current source, and thus a rate of charge of the capacitor, is determined according to the plurality of data bits output by the adder 308. In this way, the PWM signal is generated according to the plurality of data bits output by the adder 308 such that it varies according to both the ramp signal generated by the ramp generator 304 and the output bits of the register 306.

Figure 5:
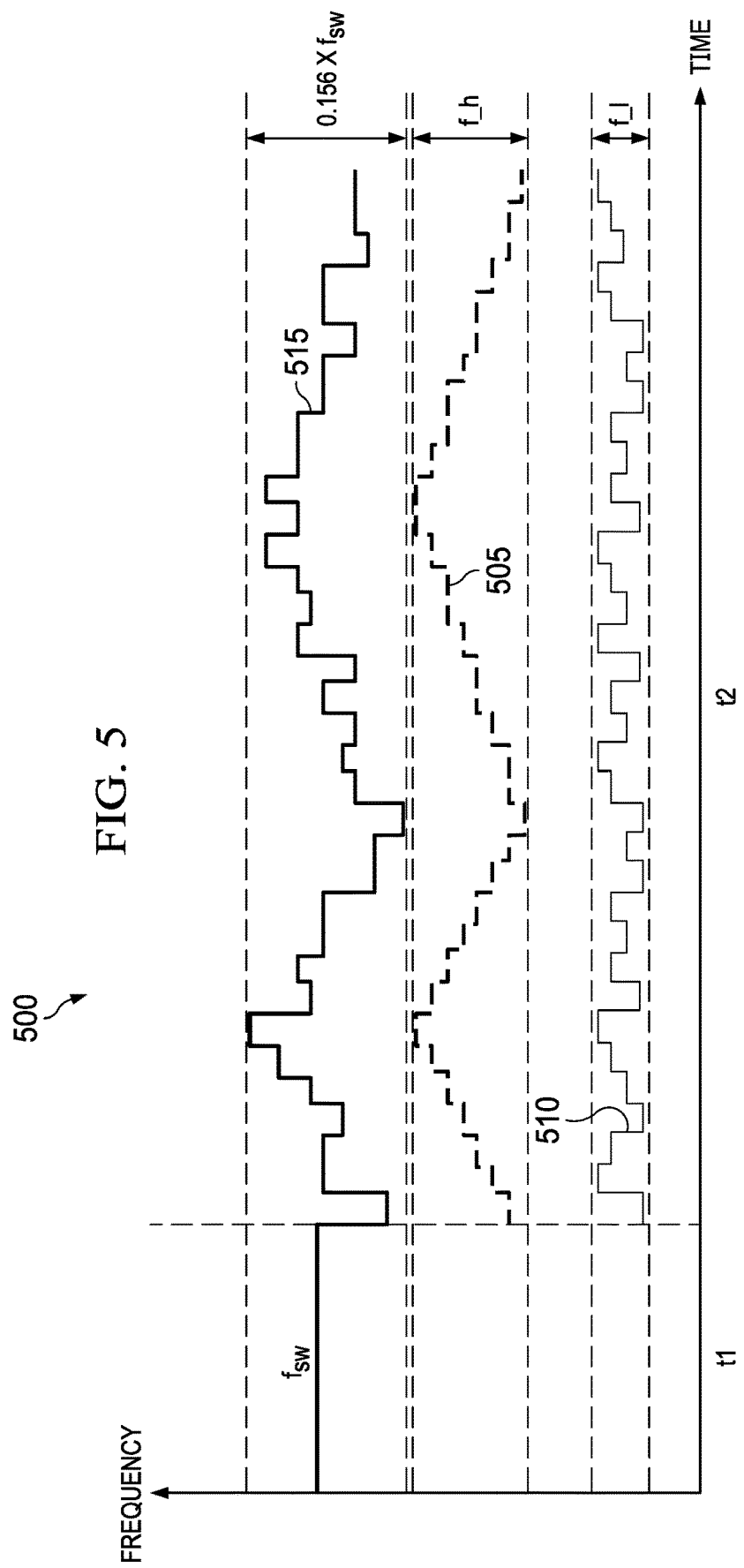
FIG. 5 shows a diagram of illustrative signal waveforms in accordance with various examples.

Turning for a moment to FIG. 5, an illustrative diagram 500 of signal waveforms is shown. The diagram 500 illustrates a signal 505, a signal 510, and a signal 515. In at least one example, the signal 505 is the ramp signal generated by the ramp generator 304 of FIG. 3, the signal 510 is the PRSS signal output by the register 306 of FIG. 3, and the signal 515 is the output of the adder 308 of FIG. 3. The signal 515, in at least some examples, is further indicative of an output of the oscillator 310 such that the signal 515 is indicative of a switching frequency (f_sw) at which a power converter receiving the output of the oscillator 310 will be controlled. A y-axis of the diagram 500 is representative of frequency and an x-axis of the diagram 500 is representative of time. During a time period shown as t1 in the diagram 500, f_sw remains substantially constant. During this time period, dithering according to the present disclosure is disabled. During a time period shown as t2 in the diagram 500, dithering is enabled according to the present disclosure and a switching frequency f_sw during t2 varies in value within a bandwidth of about 0.156 times the f_sw during t1. Additionally, in at least some examples, the signal 505 varies in frequency in a bandwidth of f_h and the signal 510 varies in frequency in a bandwidth of f_l, where f_l is less than f_h.

Returning to FIG. 3, in at least some examples, the PWM generator 300 includes one or more components (not shown) configured to bypass the adder 308. For example, in some circumstances, it may be preferable to bypass the adder 308 for characterization, monitoring, or other observation of the data bits output by the ramp generator 304. In other examples, the components configured to bypass the adder 308 enable the PWM generator 300 to be selectively configured to operate in a DRSS mode or an ARSS mode. For example, in one implementation, a multiplexer is coupled between each output terminal of the register 306 and the adder 308. For example, each multiplexer receives a respective data bit output by the register 306 at a first input terminal, a second input terminal of the multiplexer is coupled to a ground node, and an output terminal of the multiplexer is coupled to the adder 308. Each multiplexer is configured to receive a same select signal such that the PWM generator 300 is configurable by selecting the second input of each of the multiplexers to bypass generation of the DRSS signal and instead generate a periodic analog type waveform, as described above. In another example, a multiplexer is coupled between each output terminal of the ramp generator 304 and the oscillator 310. For example, each multiplexer receives a respective data bit output by the ramp generator 304 at a first input terminal, a second input terminal of the multiplexer is coupled to a corresponding output of the adder 308, and an output terminal of the multiplexer is coupled to the oscillator 310. Each multiplexer is configured to receive a same select signal such that the PWM generator 300 is configurable by selecting the second input of each of the multiplexers to bypass generation of the DRSS signal and instead generate a periodic analog type waveform, as described above.

In some examples, such as current-mode power converters, a slope compensation signal is generated by a controller for compensation of an error signal generated by the controller for use in controlling a power converter. In such examples, the slope compensation signal is trimmed based on a same input as received by the oscillator 310 (e.g., DRSS_BIT0, DRSS_BIT1, . . . DRSS_BITX of FIG. 3, illustrated collectively in FIG. 2 as the signal COMP). Trimming a signal, in at least some examples, includes modifying and/or generating a value of that signal at a particular point in time based on a value of the signal on which the trimming is based. Trimming the slope compensation signal according to the same input as received by the oscillator 310 minimizes a ripple in an output voltage of the power converter. In other examples, such as a voltage-mode power converter, a voltage ramp is instead trimmed according to the same input as received by the oscillator 310, again minimizing a ripple in an output voltage of the power converter.

Additionally, in at least some examples, though not shown in FIG. 3, the PWM generator 300 comprises a second ramp generator, and may further comprise a second clock divider. The second ramp generator and/or second clock divider together generate a second ramp signal in a manner substantially similar to that of the clock divider 302 and ramp generator 304. The output of the second ramp generator, in some examples, has a higher frequency than the output of the ramp generator 304. In such an example, the output of the second ramp generator is provided to the adder 308 in place of the output of the register 306 (e.g., in place of PR_BIT0 and PR_BIT1).

Figure 6:
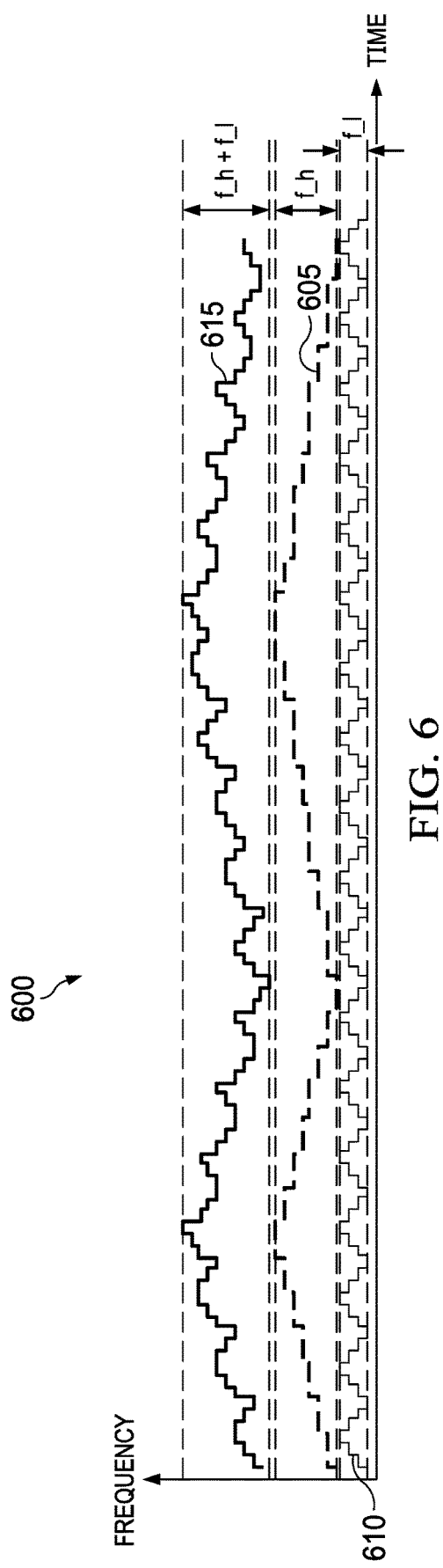
FIG. 6 shows a diagram of illustrative signal waveforms in accordance with various examples.

Turning now to FIG. 6, an illustrative diagram 600 of signal waveforms is shown. In at least some examples, the diagram 600 is illustrative of a plurality of signals present in the circuit 300 of FIG. 3. Accordingly, reference may be made to at least some components and/or signals of FIG. 3 in describing the diagram 600. The diagram 600 illustrates a signal 605, a signal 610, and a signal 615. In at least one example, the signal 605 is the ramp signal generated by the ramp generator 304 of FIG. 3, the signal 610 is another ramp signal, and the signal 615 is the output of the adder 308 of FIG. 3 (e.g., when the adder 308 receives the signal 605 and the signal 610 as inputs, receiving the signal 610 in place of a PRSS signal). The signal 615, in at least some examples, is further indicative of an output of the oscillator 310 such that the signal 615 is indicative of f_sw for a power converter controlled at least partially according to the output of the oscillator 310. A y-axis of the diagram 600 is representative of frequency and an x-axis of the diagram 600 is representative of time. As illustrated in the diagram 600, in at least some examples, a bandwidth of the signal 605 is greater than a bandwidth of the signal 610 and a bandwidth of the signal 615 is approximately equal to the bandwidths of the signal 605 and 610 added together.

Figure 7:
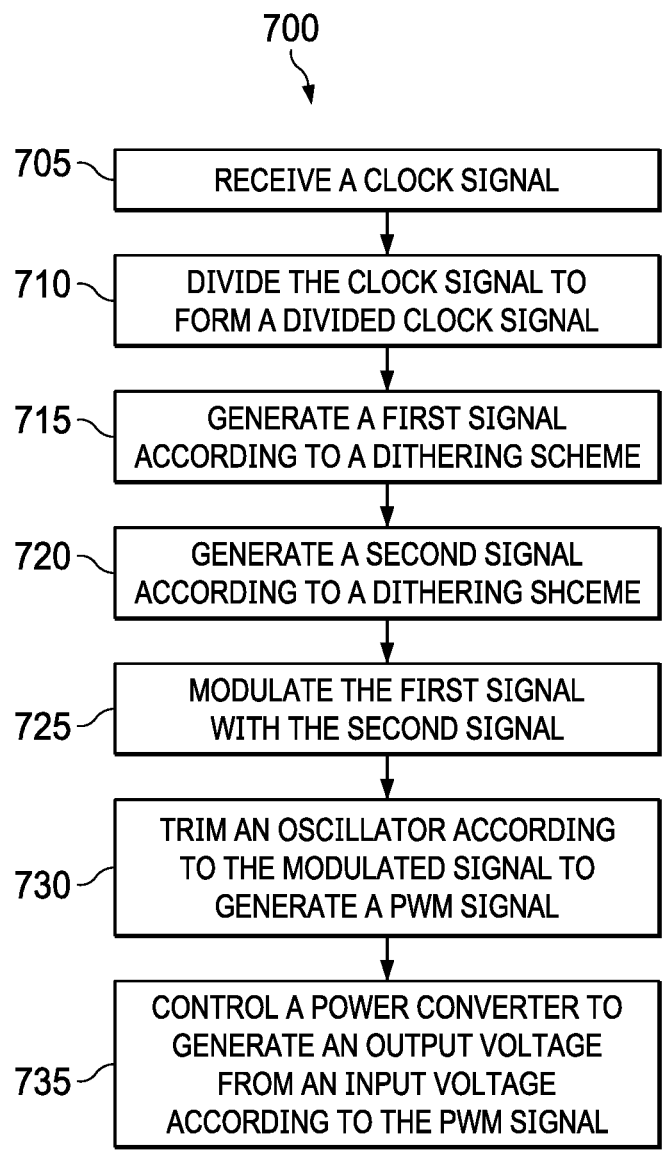
FIG. 7 shows a flowchart of an illustrative method in accordance with various examples.

Turning now to FIG. 7, a flowchart of an illustrative method 700 is shown. In at least some examples, the method 700 is a method of PWM signal generation. In some examples, the PWM signal changes in frequency with each clock cycle. For example, in at least some implementations, the PWM signal is generated according to DRSS dithering that combines multiple spread spectrum schemes or modulations in generation of the PWM signal. The method 700 is implemented, in some examples, in a PWM generator such as the PWM generator 300 of FIG. 3.

At operation 705, a clock signal is received. In at least some examples, the clock signal is CLK, as described above. The clock signal is, in some examples, the output of an oscillator, a PWM generator, or another circuit capable of generating a clock signal. At operation 710, the clock signal is divided to form a divided clock signal. In at least some examples, the divided clock signal is CLK_DIV, as described above. The clock signal is divided, in at least some examples, according to an output of a linear feedback shift register. In other examples, the clock signal is divided by any other suitable value. In at least some examples, the value varies from clock cycle to clock cycle to prevent the divided clock signal from remaining at the same frequency for multiple sequential clock cycles.

At operation 715, a first signal is generated according to a dithering scheme. The first signal is, for example, an analog ramp, or a plurality of data bits representative of an analog ramp. In other examples, the first signal is an ARSS signal or a periodic analog type waveform, as described above. In yet other examples, the first signal is a PRSS signal. In at least one implementation, the first signal is generated by a ramp generator. The first signal is generated according to the divided clock signal generated at operation 710 such that the first signal changes in frequency from clock cycle to clock cycle.

At operation 720, a second signal is generated according to a dithering scheme. The second signal is, for example, an analog ramp, or a plurality of data bits representative of an analog ramp. In other examples, the second signal is an ARSS signal or a periodic analog type waveform, as described above. In yet other examples, the second signal is a PRSS signal. In some examples, the dithering scheme at operation 720 is the same as the dithering scheme at the operation 715. In other examples, the dithering scheme at operation 720 is different than the dithering scheme at operation 715. In at least one implementation, the second signal is generated based on one or more bits output by a linear feedback shift register, for example, such that the one or more bits form a PRSS signal.

At operation 725, the first signal is modulated by or with the second signal. In some examples, the first signal is modulated by the second signal by adding the second signal to the first signal. The modulated first signal is, in some examples, a DRSS signal. Modulating the first signal with the second signal, in at least some examples, combines the dithering scheme of the first signal with the dithering scheme of the second signal. Combining the dithering scheme of the first signal with the dithering scheme of the second signal, in some examples, causes a greater variation in switching frequency between sequential clock cycles than alternative approaches such as ARSS, PRSS, or analog dithering that use a single dithering scheme.

At operation 730, an oscillator is trimmed according to the DRSS signal generated at operation 725 to generate a PWM signal. Trimming the oscillator according to the DRSS signal, in at least some examples, causes the oscillator to generate the PWM signal having a frequency that changes as the DRSS signal changes in value. The frequency changes both according to the first signal generated at operation 715 and the second signal generated at operation 720. Changing the frequency of the PWM signal according to both the first signal and the second signal enables improved EMI performance of a switching component controlled according to the PWM signal for a frequency range for which the first signal is optimized and a frequency range for which the second signal is optimized. For example, when the first signal is an analog ramp signal, the first signal is optimized for improving EMI performance at low frequencies. Similarly, when the second signal is a PRSS signal, the second signal is optimized for improving EMI performance at high frequencies. Thus, by modulating the first signal with the second signal at operation 725 and generating the PWM signal according to this modulated signal at operation 730, the PWM signal becomes optimized for improving EMI performance at both the low frequencies and the high frequencies.

At operation 735, a power converter is controlled to generate an output voltage from an input voltage according to the PWM signal. For example, the PWM signal drives a gate terminal (or drives a gate driver that in turn drives the gate terminal) of at least one power transistor of the power converter to cause the power transistor to turn on and off to enable or disable current flow through the power transistor to generate VOUT.

Turning now to FIG. 8, a table 800 of illustrative pseudocode is shown. In at least some examples, the present disclosure is at least partially implementable via software. For example, at least some operations of the method 700 of FIG. 7 may be performed by programming a processor to perform certain tasks. The table 800 illustrates one example of pseudocode for performing such programming. However, the pseudocode of table 800 is only one approach for programming the processor to perform functions of the present disclosure and other approaches achieving the same or similar results are encompassed within the scope of the present disclosure.

As illustrated by the table 800, variables clk_frequency, clk_divided_frequency, clk_divided_frequency_2, and pseudorandom are defined. A random number (rand) is generated. Subsequently, a first ramp signal (ramp) is generated and a second ramp signal (ramp_2) is generated. DRSS is subsequently generated either by adding ramp and rand (e.g., to modulate ramp according to rand, which is in some examples a PRSS signal) or by adding ramp and ramp_2. Based on DRSS, a frequency of a clock signal is modified.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with BJT, replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
   a linear feedback shift register (LFSR) comprising:
      a clock input terminal configured to receive a clock signal,
      a first output terminal, and
      a second output terminal;
   a clock divider comprising:
      a clock input terminal configured to receive the clock signal,
      a first input terminal coupled to the first output terminal of the LFSR,
      a second input terminal coupled to the second output terminal of the LFSR, and
      an output terminal;
   a ramp generator comprising:
      an input terminal coupled to the output terminal of the clock divider, and
      an output terminal;
   an adder comprising:
      a first input terminal coupled to the output terminal of the ramp generator,
      a second input terminal coupled to the first output terminal of the LFSR, and
      an output terminal; and
   an oscillator comprising:
      a first input terminal coupled to the output terminal of the adder, and
      an output terminal.

2. The circuit of claim 1, wherein the LFSR further comprises a third output terminal, and wherein the clock divider further comprises a third input terminal coupled to the third output terminal of the LFSR.

3. The circuit of claim 1, wherein the ramp generator further comprises a second output terminal, a third output terminal, and a fourth output terminal, and wherein the adder further comprises a third input terminal coupled to the second output terminal of the ramp generator, a fourth input terminal coupled to the third output terminal of the ramp generator, a fifth input terminal coupled to the fourth output terminal of the ramp generator, and a sixth input terminal coupled to the second output terminal of the LFSR.

4. The circuit of claim 3, wherein the adder further comprises a second output terminal, a third output terminal, and a fourth output terminal, and wherein the oscillator further comprises a second input terminal coupled to the second output terminal of the adder, a third input terminal coupled to the third output terminal of the adder, and a fourth input terminal coupled to the fourth output terminal of the adder.

5. The circuit of claim 1, further comprising a power converter comprising a power transistor having a gate terminal configured to couple to the output terminal of the oscillator.

6. The circuit of claim 1, wherein the clock divider is configured to divide the received clock signal according to a value received as at least one digital data bit by the clock divider from the LFSR, and wherein the ramp generator is configured to generate a ramp signal varying in frequency between sequential cycles of the divided clock signal and output the ramp signal as a digital value.

7. The circuit of claim 6, wherein the adder is configured to modulate the ramp signal according to at least one digital data bit received from the LFSR to generate a dual random spread spectrum (DRSS) signal including both a dithering profile of the ramp signal and a dithering profile associated with the at least one digital data bit received from the LFSR.

8. The circuit of claim 7, wherein the oscillator is configured to generate a pulse width modulation signal according to the DRSS signal, wherein the pulse width modulation signal varies in frequency according to both the ramp signal and the at least one digital data bit received by the adder from the LFSR.

9. A circuit, comprising:
a linear feedback shift register (LFSR) clocked by a clock signal, the LFSR configured to output a pseudorandom value in a digital data format;
a clock divider configured to receive the clock signal and divide the clock signal by the pseudorandom value to generate and output a divided clock signal;
a ramp generator configured to receive the divided clock signal, generate a ramp signal according to the divided clock signal, and output the ramp signal in the digital data format;
an adder configured to modulate the ramp signal with the pseudorandom value to generate a dual random spread spectrum signal; and
an oscillator configured to receive the dual random spread spectrum signal and generate a pulse width modulation signal according to the dual random spread spectrum signal.

10. The circuit of claim 9, further comprising a power transistor configured to be controlled by the pulse width modulation signal, wherein a switching action of the power transistor under control of the pulse width modulation signal generates electromagnetic interference having less peak energy than a pulse width modulation signal generated according to only the ramp signal or only the pseudorandom value.

11. The circuit of claim 9, wherein the adder modulates the ramp signal with the pseudorandom value to cause the dual random spread spectrum signal to vary in frequency in a single cycle of the clock signal a greater amount than the ramp signal varies in frequency during the single cycle of the clock signal.

12. The circuit of claim 11, wherein the adder modulates the ramp signal with the pseudorandom value by adding the pseudorandom value to the ramp signal during each cycle of the clock signal, and wherein the adder outputs the dual random spread spectrum signal in the digital data format.

13. The circuit of claim 9, wherein a frequency of the pulse width modulation signal varies between sequential cycles of the clock signal.

14. The circuit of claim 9, wherein the oscillator generates the pulse width modulation signal by programming a current source to charge a capacitor with a current determined at least partially according to the dual random spread spectrum signal.

15. A system, comprising:
a pulse width modulation generator configured to generate a pulse width modulation signal by:
generating a first signal having a first dithering profile and a first frequency bandwidth;
generating a second signal having a second dithering profile and a second frequency bandwidth greater than the first frequency bandwidth;
modulating the second signal with the first signal to generate a dual random spread spectrum signal; and
generating the pulse width modulation signal according to the dual random spread spectrum signal.

16. The system of claim 15, wherein the first signal is a pseudorandom spread spectrum signal, and wherein the second signal is a periodic analog type waveform.

17. The system of claim 16, wherein the pulse width modulation generator comprises:
a linear feedback shift register (LFSR) clocked by a clock signal and configured to output the pseudorandom spread spectrum signal;
a clock divider configured to receive the clock signal and divide the clock signal by at least a portion of the pseudorandom spread spectrum signal to generate and output a divided clock signal;
a ramp generator configured to receive the divided clock signal and generate the periodic analog type waveform according to the divided clock signal;
an adder configured to modulate the periodic analog type waveform with the pseudorandom spread spectrum signal to generate the dual random spread spectrum signal; and
an oscillator configured to receive the dual random spread spectrum signal and generate the pulse width modulation signal according to the dual random spread spectrum signal.

18. The system of claim 17, wherein the dual random spread spectrum signal varies in frequency between sequential cycles of the clock signal to a greater degree than either the periodic analog type waveform or the pseudorandom spread spectrum signal individually.

19. The system of claim 17, wherein the oscillator generates the pulse width modulation signal to vary in frequency between sequential cycles of the clock signal by programming a current source to charge a capacitor with a current determined at least partially according to the dual random spread spectrum signal.

20. The system of claim 15, wherein the first signal is a periodic analog type waveform, and wherein the second signal is a pseudorandom spread spectrum signal.

21. The system of claim 15, wherein the first signal is a periodic analog type waveform, and wherein the second signal is a second periodic analog type waveform.

22. The system of claim 15, wherein the first signal is a triangular ramp signal at a first frequency, and wherein the second signal is a triangular ramp signal at a second frequency.

23. The system of claim 15, further comprising:
a load;
a switched mode power supply coupled to the load and the pulse width modulation generator, wherein the switched mode power supply comprises a power transistor, and wherein the power transistor is switched on and off at least partially according to the pulse width modulation signal to generate an output voltage provided to the load.

24. The system of claim 23, wherein the pulse width modulation signal mitigates generation of electromagnetic interference in the switching on and off of a power transistor in a high frequency band based on components of the dual random spread spectrum signal attributable to the first signal and in a low frequency band based on components of the dual random spread spectrum signal attributable to the second signal.

* * * * *